(12) United States Patent
Zimmerman et al.

(10) Patent No.: US 7,536,267 B2
(45) Date of Patent: May 19, 2009

(54) BUILT-IN SELF TEST FOR MEMORY INTERCONNECT TESTING

(75) Inventors: David Zimmerman, El Dorado Hills, CA (US); Jay J. Nejedlo, Wilsonville, OR (US)

(73) Assignee: Intel Corporation, Santa Clara, CA (US)

( * ) Notice: Subject to any disclaimer, the term of this patent is extended or adjusted under 35 U.S.C. 154(b) by 408 days.

(21) Appl. No.: 11/289,186

(22) Filed: Nov. 28, 2005

(65) Prior Publication Data

US 2006/0080058 A1  Apr. 13, 2006

Related U.S. Application Data

(62) Division of application No. 10/668,817, filed on Sep. 22, 2003, now abandoned.

(51) Int. Cl.
*G01R 31/00* (2006.01)
(52) U.S. Cl. ...................................... 702/117
(58) Field of Classification Search .................. 702/117
See application file for complete search history.

(56) References Cited

U.S. PATENT DOCUMENTS

| | | | |
|---|---|---|---|
| 5,047,926 A | 9/1991 | Kuo et al. | |
| 5,377,199 A | 12/1994 | Fandrich | |
| 5,436,856 A | 7/1995 | Sauvage | |
| 5,596,715 A | 1/1997 | Klein et al. | |
| 5,704,035 A | 12/1997 | Shipman | |
| 5,726,991 A | 3/1998 | Chen et al. | |
| 5,757,171 A | 5/1998 | Babcock | |
| 5,845,136 A | 12/1998 | Babcock | |
| 5,875,293 A | 2/1999 | Bell et al. | |
| 5,954,523 A | 9/1999 | Babcock | |
| 6,047,373 A | 4/2000 | Hall et al. | |

(Continued)

FOREIGN PATENT DOCUMENTS

WO    WO 99/39218    8/1999

OTHER PUBLICATIONS

Yeoh Eng Hong, An overview of advanced failure analysis technique for Pentium and Pentium Pro Microprocessors, Intel Technology Journal Q2, 1998, p. 1-11.*

(Continued)

*Primary Examiner*—Tung S Lau
(74) *Attorney, Agent, or Firm*—Blakely, Sokoloff, Taylor & Zafman LLP (57) ABSTRACT

In some embodiments, built-in self-test logic is provided for an integrated circuit (IC) device having memory controller logic to generate address and command information for accessing a memory device. Driver circuits are on-chip with the memory controller logic. The driver circuits have outputs that are coupled to on-chip signal pads, respectively. The BIST logic is coupled between the driver circuits and the controller logic. The BIST logic is to transmit, at speed, address and command information that has been generated by the controller logic using the driver circuits in a normal mode of operation for the device. In addition, the BIST logic is able to transmit, at speed, test symbols using the driver circuits in a test mode of operation for the IC device, during which a chip-to-chip connection between the IC device and another device is tested. Other embodiments are also described and claimed.

9 Claims, 4 Drawing Sheets

U.S. PATENT DOCUMENTS

| | | |
|---|---|---|
| 6,073,253 A | 6/2000 | Nordstrom et al. |
| 6,089,879 A | 7/2000 | Babcock |
| 6,101,457 A | 8/2000 | Barch et al. |
| 6,101,578 A | 8/2000 | Patwardhan et al. |
| 6,122,733 A | 9/2000 | Christeson et al. |
| 6,256,731 B1 | 7/2001 | Hall et al. |
| 6,271,704 B1 | 8/2001 | Babcock et al. |
| 6,357,027 B1 | 3/2002 | Frankowsky |
| 6,385,236 B1 | 5/2002 | Chen |
| 6,502,212 B1 | 12/2002 | Coyle et al. |
| 6,505,317 B1 | 1/2003 | Smith et al. |
| 6,530,052 B1 | 3/2003 | Khou et al. |
| 6,564,348 B1 | 5/2003 | Barenys et al. |
| 6,609,221 B1 | 8/2003 | Coyle et al. |
| 2002/0073374 A1 | 6/2002 | Danialy et al. |
| 2002/0089887 A1 | 7/2002 | Hii et al. |
| 2002/0194545 A1 | 12/2002 | Abbott |
| 2003/0233607 A1 | 12/2003 | Appinger et al. |
| 2004/0036494 A1 | 2/2004 | Mak et al. |
| 2004/0102916 A1 | 5/2004 | Chen |
| 2004/0107395 A1 | 6/2004 | Volkerink et al. |
| 2004/0117709 A1 | 6/2004 | Nejedlo et al. |
| 2004/0186688 A1 | 9/2004 | Nejedlo et al. |

OTHER PUBLICATIONS

Doran, Mark—*Extensible Firmware Interface EFI 1.10 and Beyond: An Overview*, Intel Developer Forum, Sep. 9-12, 2002, pp. 1-26.

Hong, Yeoh Eng, et al.—*An Overview of Advanced Failure Analysis Techniques for Pentium® and Pentium® Pro Microprocessors*, Intel Technology Journal Q2, '98, pp. 1-11.

Sun Microelectronics MicroSPARC-IIep™ —*Introduction to JTAG Boundary Scan*, Sun Microsystems, Inc. White Paper, Jan. 1997, pp. 1-8.

Deboo, Gordon J., et al., "Integrated Circuits and Semiconductor Devices: Theory and Application", Second Edition, 1977, (pp. 74, 76, 77 and 78).

Non-Final Office Action (dated Jan. 21, 2005), U.S. Appl. No. 10/688,817, filed Sep. 22, 2003, First Named Inventor: David Zimmerman, (10 pages).

Non-Final Office Action (dated Aug. 1, 2005), U.S. Appl. No. 10/688,817, filed Sep. 22, 2003, First Named Inventor: David Zimmerman, (12 pages).

Non-Final Office Action (dated Oct. 27, 2005), U.S. Appl. No. 10/688,817, filed Sep. 22, 2003, First Named Inventor: David Zimmerman, (12 pages).

Knorr, Eric, "The PC Bible", Second Edition, 1995, (pp. 30, 31, 143 and 901).

\* cited by examiner

FIG. 4

BUILT-IN SELF TEST FOR MEMORY INTERCONNECT TESTING

RELATED U.S. PATENT APPLICATIONS

This application is a divisional of Ser. No. 10/668,817, filed on Sep. 22, 2003, now abandoned by applicants, David Zimmerman and Jay J. Nejedlo, entitled "Built-In Self Test for Memory Interconnect Testing". Other related applications are Ser. No. 10/319,517, filed Dec. 16, 2002, entitled "Testing Methodology and Apparatus for Interconnects" (pending U.S. Publication No. 2004-0117709 A1); and Ser. No. 10/393,223, filed Mar. 20, 2003, entitled "A Reusable, Built-In Self-Test Methodology for Computer Systems" (pending U.S. Publication No. 2004-0186688 A1).

BACKGROUND

Some embodiments of the invention described below are related to methodologies for testing manufactured computer systems, and in particular their main memory subsystems, to determine whether electrical specifications for chip-to-chip connections (also referred to here as interconnects) have been met, as well as whether the integrated circuit (IC) devices in the main memory subsystem have been assembled or installed correctly. Other embodiments are also described and claimed.

Industry trends for high performance computer systems, such as those that use a Pentium processor and associated system chipset by Intel Corp., Santa Clara, California, are towards faster product cycle times (time to market) with sustained high quality. At the same time, chip-to-chip connection or bus speeds are increasing to several hundred megahertz and, in the case of serial links, beyond several gigahertz (GHz). Device pin densities are also increasing, again to meet the need for greater performance in the computer system. These demands render conventional testing techniques such as oscilloscope and logic analyzer probing less reliable, and often impossible particularly on high speed interfaces, both in the high volume manufacturing setting, as well as earlier in the electrical validation and verification stage of device and platform manufacturing.

At the board and platform level, the system has its primary components, including the processor, system chipset, and memory, installed on a motherboard. In that stage of manufacturing, transaction-based tests have been used, in a board or platform high volume manufacturing setting, to verify a wide range of storage and logic functions of the system. Such tests evaluate whether the memory subsystem and the I/O subsystem work according to their electrical specifications. The test is performed by the processor executing a special test routine, during or after booting an operating system (OS) program, that causes test patterns that are part of the test routine to be written to and then read from addresses that span the computer system. However, faults of a high frequency type (such as due to cross talk between adjacent signal lines and inter-symbol interference (ISI) due to transmission line effects) cannot be detected or isolated using such techniques, due to the coarse test granularity and high instruction overhead associated with running an OS-based test program.

Another type of computer system test calls for the processor to execute firmware/software that operates at a lower level than an OS-based program, prior to booting the operating system. These include basic I/O system (BIOS) and extended firmware interface (EFI) programs. Although these types of tests provide relatively low-level, and hence more accurate, control of component functionality and interconnect buses, system interactions cannot be stressed to their bandwidth specifications in such tests. In addition, the ability of BIOS/EFI tests to isolate a fault with sufficient granularity is also limited.

Finally, there is a low level technique known as boundary scan testing (or the Joint Test Access Group, JTAG, protocol) which calls for on-chip circuitry used to control individual bits transmitted between components. Once again, however, there is no provision for testing high frequency faults. For example, a boundary scan test may detect "opens" and "shorts" while running at a 10 MHz clock, whereas normal signaling speed on the interconnect will be in the hundreds of MHz or even GHz range.

BRIEF DESCRIPTION OF THE DRAWINGS

The invention is illustrated by way of example and not by way of limitation in the figures of the accompanying drawings in which like references indicate similar elements. It should be noted that references to "an" embodiment of the invention in this disclosure are not necessarily to the same embodiment, and they mean at least one.

DETAILED DESCRIPTION

Some embodiments of the invention described below are directed to techniques for enhancing some or all components of a main memory subsystem with built-in self test (BIST) logic circuitry that can test the main memory subsystem. Each enhanced IC component or device has BIST logic that is designed to communicate with other BIST logic, or with initialized components of the subsystem, to determine whether an electrical specification of the subsystem is satisfied or whether the components of the subsystem have been properly installed. The BIST capability here, which may also be referred to as interconnect BIST (IBIST), is capable of testing chip-to-chip connections between IC devices at speed, that is substantially at the same or higher signaling speed (or symbol rate) as that used in a normal mode of operation for the subsystem. The IBIST logic also has a transparent, or also referred to as "normal", mode in which the IC device involved can operate to perform its primary memory-related function, e.g., to transmit address and command information and/or data that are typically needed for accessing the subsystem. According to an embodiment of the invention, the IBIST capability relies upon design for test (DFT) on-chip logic to establish test conditions and test symbols, execute a test of the interconnect, and return results of the test to, for example, an on-board platform management system or to an external tester. With IBIST, the memory subsystem can in effect test itself for defects and verify the high speed performance of chip-to-chip connections in the subsystem at the platform level, high volume manufacturing stage (for example, computer system printed wiring board manufacturing). In other embodiments, the IBIST capability in a device can self-test its IC package connections to a test board, at the IC device validation stage or later during volume manufacturing of the IC package.

Figure 1:
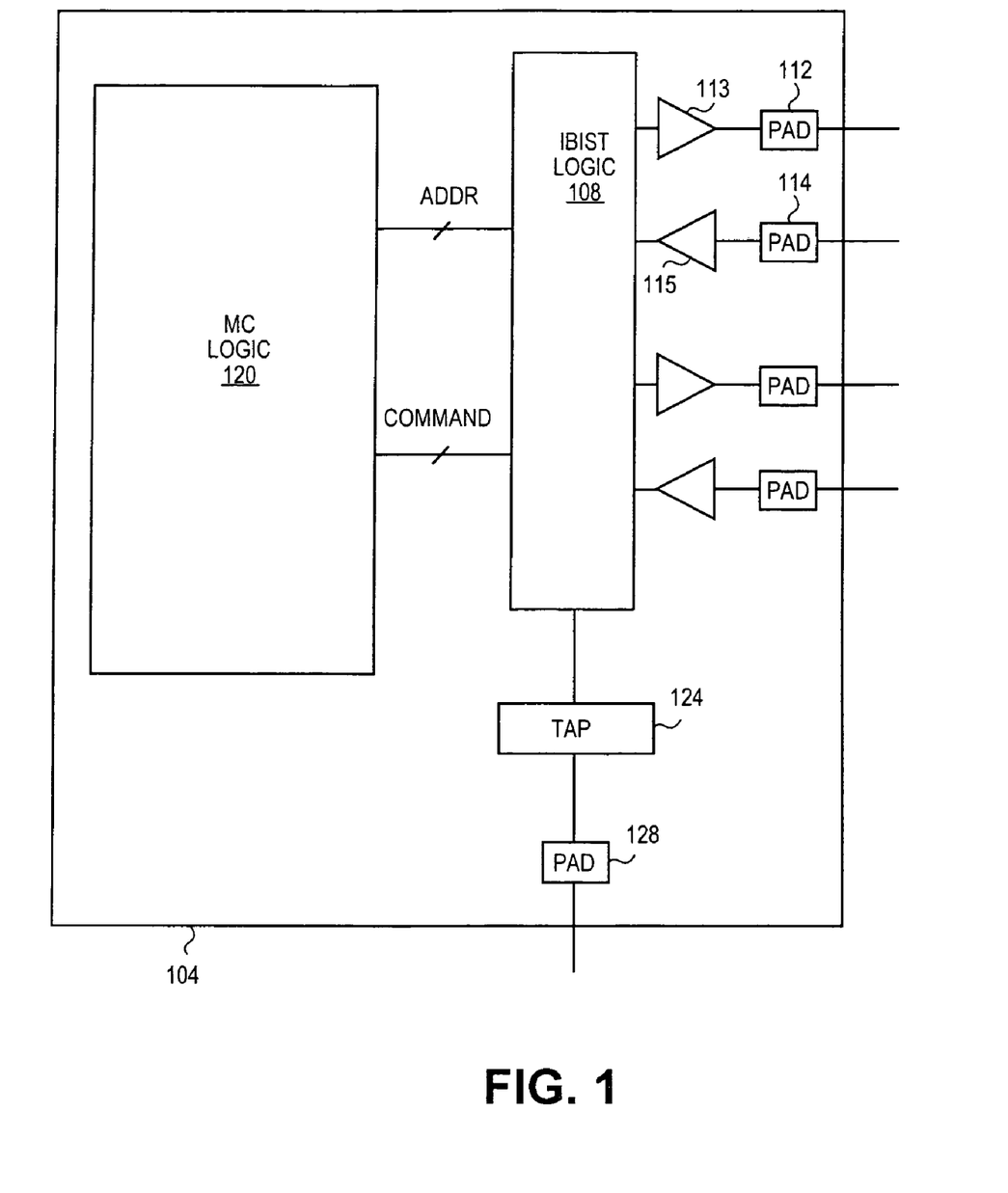
FIG. 1 illustrates a block diagram of an integrated circuit device with memory controller logic and interconnect built-in self test logic.

Referring now to FIG. 1, this figure illustrates a block diagram of an IC device 104. The device has been enhanced with IBIST logic 108 which may be implemented as on-chip logic circuitry that has the ability to perform a test of a chip-to-chip connection for the device 104. In this embodiment, the chip-to-chip connection includes the analog driver and receiver circuitry and transmission lines, between the IBIST logic 108 and the interconnect pins (not shown) of an IC package containing the device 104. This connection includes die signal pads 112 which are coupled to the outputs of driver circuits 113, and die signal pads 114 which are coupled to the inputs of receiver circuits 115. The driver and receiver circuits serve to translate between signaling on the transmission lines and on-chip logic signaling.

The IBIST logic 108 is positioned between the driver circuits 113 and receiver circuits 115 on one side and memory controller (MC) logic 120 on the other. The MC logic 120 provides address and command information for accessing a memory device (not shown), to the IBIST logic 108. In response, the IBIST logic 108 transmits, at speed, this address and command information using the driver circuits 113, in a normal or transparent mode of operation for the IC device 104. In contrast, in a test mode of operation for the IC device 104, the IBIST logic 108 may be configured as a test master that transmits, once again at speed, test symbols using the driver circuits 113. The test mode of operation is one during which a chip-to-chip connection between the IC device 104 and another device is tested.

The die signal pads 114 and receiver circuits 115 allow bi-directional communications with another device. To support that capability, the IBIST logic 108 includes further logic coupled between the receive circuits 115 and the MC logic 120 to forward data, received by the receiver circuits 115, to the MC logic 120 in the normal mode of operation for the device 104. For example, this data may be the contents of memory locations read from a memory device. On the other hand, in the test mode of operation, the IBIST logic 108 may be configured to act as a test slave which automatically determines error in test symbols that have been received by the receiver circuits 115. This automatic "checking" ability can be extended to some or all of the die signal pads 114 of the IC device 104 that are part of the chip-to-chip connection being tested.

Information regarding the determined errors, if any, by the IBIST logic 108 may be transferred out of the IC device 104 via a test access port (TAP) 124. The TAP 124 is coupled to a separate die pad 128 used for transferring the results of testing performed by the IBIST logic 108. The pad 128 may in some cases be also used for loading the IBIST logic 108 with a pattern of test symbols that are driven and checked by the IBIST logic 108 when performing an interconnect test of the chip-to-chip connection. The IBIST logic 108 and the TAP 124 may be designed to have boundary scan chain capability, to scan in test pattern information and scan out the error information according to conventional boundary scan chain techniques used for testing multiple chain linked devices in a computer system board. As an alternative, any error information and/or test pattern information may be transferred to and from the IC device 104 via internal registers (not shown) that are accessible by either a separate low speed test bus such as the System Management Bus (SMBUS) (not shown) or are mapped into the central processing unit (CPU) I/O addressing space of the computer system.

Figure 2:
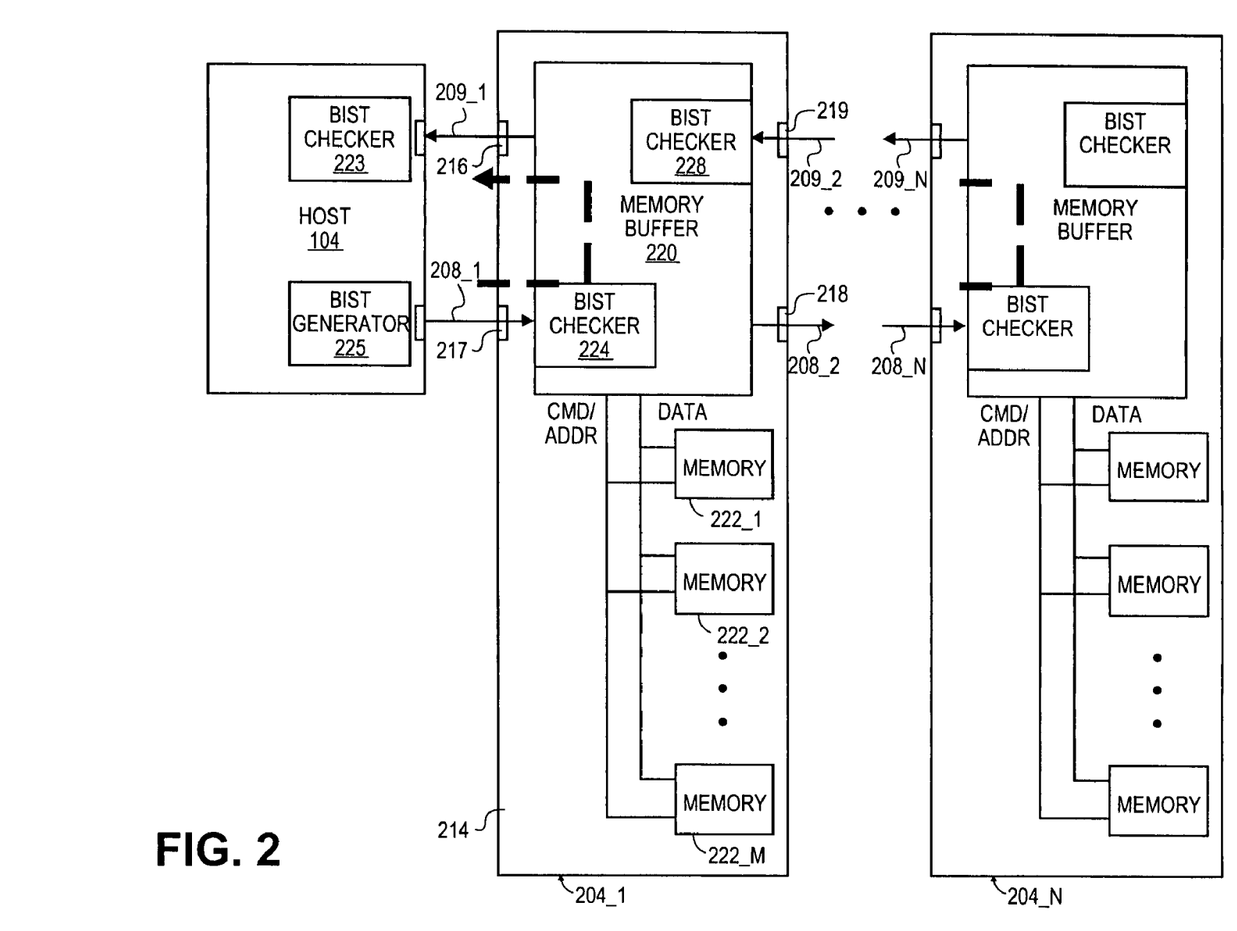
FIG. 2 shows a block diagram of a main memory subsystem enhanced with built-in self test capability.

Turning now to FIG. 2, a block diagram of a main memory subsystem that has been enhanced with IBIST capability is shown. The subsystem has a number of memory IC modules 204 that are connected to each other via point-to-point, and in this case predominantly unidirectional, links 208, 209. In such a configuration, the IC device 104 acts as a host in which there is memory controller logic (not shown) that communicates directly with only one of the modules 204, in this case the module 204_1; each module 204 has repeater capability, that is it can forward address, command, and data to the next adjacent module. Thus, for instance, the module 204_1 receives address and command information from the host IC device 104 via an outbound link 208_1 and forwards the information (if necessary for use by other modules) via outbound link 208_2. In the reverse direction, the module 204_1 receives data (for instance the contents of a location in a memory device of the module 204_N) via an inbound link 209_2, and forwards the data to the host IC device 104 directly over an inbound link 209_1. This repeater capability is implemented in part in a memory buffer 220 to be described below.

Each memory module 204 is made of a carrier substrate 214 (such as a separate, printed wiring board with multiple signal routing layers as used for conventional dual in-line memory modules or DIMMs). A number of memory devices 222 and multiple sets of connection points 216-219 are installed (e.g., directly soldered) on the substrate 214. There are in this case four sets of connection points 216-219 that are installed on the carrier substrate 214, where each set supports multiple electrical signals, and that form the transmission line between the modules 204 and the host IC device 104. In a computer system embodiment, the links 208 and 209 are formed in a mother board or system board (not shown) through which metal traces and connector slots that constitute the links 208, 209 are provided. Other types of connections for allowing the modules 204 to communicate with each other and with the host IC device 104 may be possible.

Each module 204 further includes a number of memory devices 222 that are communicatively installed on the carrier substrate 214 (e.g., soldered). Each memory device 222 has a separate memory core array and separate address decoder logic (not shown) to store the data and provide access to it. These memory devices may be solid state, volatile or non-volatile devices such as dynamic random access memory (DRAM) devices. Each memory device may be a packaged set of one or more IC chips, where each chip has a separate memory core array and separate address decoder logic. Other ways of packaging a memory device may be used.

The memory devices 222 are communicatively coupled to a memory buffer 220 that is also installed on the substrate. Multi-drop command/address and data buses are tapped into by in this case several memory devices 222_1, 222_2, . . . 222_M to communicate with the memory buffer 220. Other configurations for connecting multiple memory devices to a memory buffer are also possible.

The memory buffer 220 is to decode local memory command, address, and data (that is, intended for one or more of the memory devices 222 that are located on the module 204_1 rather than memory devices that are located on other modules). The memory buffer 220 is designed to improve memory operation by "re-driving" the address, command and data signals. The memory buffer 220 may be external to the module 204 or it can be located on the module 204 as shown in the embodiment of FIG. 2.

Note that the data that arrives at the memory buffer 220 may be synchronized to a system reference clock, so that the clock used to detect symbols is referred to as a derived clock. As an alternative, the buffer 220 can provide a reference clock along with the transmitted (or re-driven) data—this being referred to as a forwarded clock. Yet another alternative is where the clock is embedded in the data signal, also known as embedded clock.

The memory buffer 220 may be built using a fabrication process that is different than one which is optimized for making memory devices such as DRAM devices. This allows the memory buffer 220 to be enhanced with IBIST logic more cost-efficiently than integrating the IBIST logic in the memory devices 222. The IBIST logic in the memory buffer 220 is categorized as being of two types, BIST generator and BIST checker. Their capabilities will be described below.

Still referring to FIG. 2, the memory buffer 220 acts as an interface to the host IC device 104; it has a number of driver circuits (not shown) whose outputs are coupled to the connection points 216. The buffer 220 has circuitry designed to forward read data, provided by the memory devices 222, at speed, that is at the nominal transmission or signaling rate, using the drivers in a normal mode of operation for the module 204_1. In addition, a BIST checker 224 determines error in test symbols received from outside the module 204_1. These test symbols have been received at speed, that is substantially the same as the nominal transmission rate which is high enough to evaluate high frequency faults that might appear in the normal mode of operation, using the connection points 217. The error determination is done in a test mode of operation for the module 204_1, during which a chip-to-chip connection between the module 204_1 and, in this case, the host IC device 104 is tested. More specifically, the connection in this case would include the outbound link 208_1 (which may comprise metal traces in a printed wiring board on which the host IC device 104 and memory module 204_1 are installed).

A module's interface with other modules of the memory subsystem is now described. Using the memory module 204_1 as an example, the module is enhanced with further logic that is designed to test a chip-to-chip connection between the module 204_1 and its adjacent module 204_2 (not shown). This connection to be tested includes an inbound link 209_2, connection points 219, and receiver circuitry (not shown) of the memory buffer 220. To perform such a task, test symbols are transmitted by the memory buffer 220 via the connection points 218 and outbound link 208_2. One of the memory modules that are further downstream, that is for instance module 204_2 or subsequent ones, is configured or programmed to loop these test symbols back towards the host IC device 104 via some internal loop back path (shown as a thick dotted line in FIG. 2). Next, the BIST checker 228 in the module 204_1 determines error in such test symbols that have been received, during the test mode of operation for the module 204_1.

It should be noted that in the above-described embodiment, the test symbols originated with a BIST generator 225 located in the host IC device 104, and were then forwarded by the module 204_1. An alternative implementation is to add a BIST generator (not shown) to the memory buffer 220 of a module, to originate the test symbols. This alternative embodiment allows a module to in effect test itself, for example the connections that include the connection points 218, outbound link 208_2, inbound link 209_2 and connection points 219. In addition, the connections composed of inbound link 209_1, connection points 216, outbound link 208_1 and connection points 217 can also be tested, using an additional BIST generator (not shown). In that case, the test symbols transmitted by the module 204_1 would need to be looped back towards the module 204_1 through some external mechanism such as a simple wire loop or a form of repeater circuitry. The module 204_1 as a whole, or its memory buffer 220 by itself, may be installed on a test board, for either validation self-test or volume manufacturing self-test for which a loop-back has been provided on the test board.

The main memory subsystem depicted in FIG. 2 can be part of a computer system in which the host IC device 104 is a processor device that includes a processor core (not shown) coupled to memory controller logic 120 (see FIG. 1) to access programs stored in the main memory modules 204. As an alternative, the host IC device 104 may be a system chip set device, or also referred to as a system interface device, that a processor of a computer system uses to access the main memory modules 204 as well as computer system peripherals such as a hard disk drive, a display monitor, and a keyboard (not shown).

Figure 3:
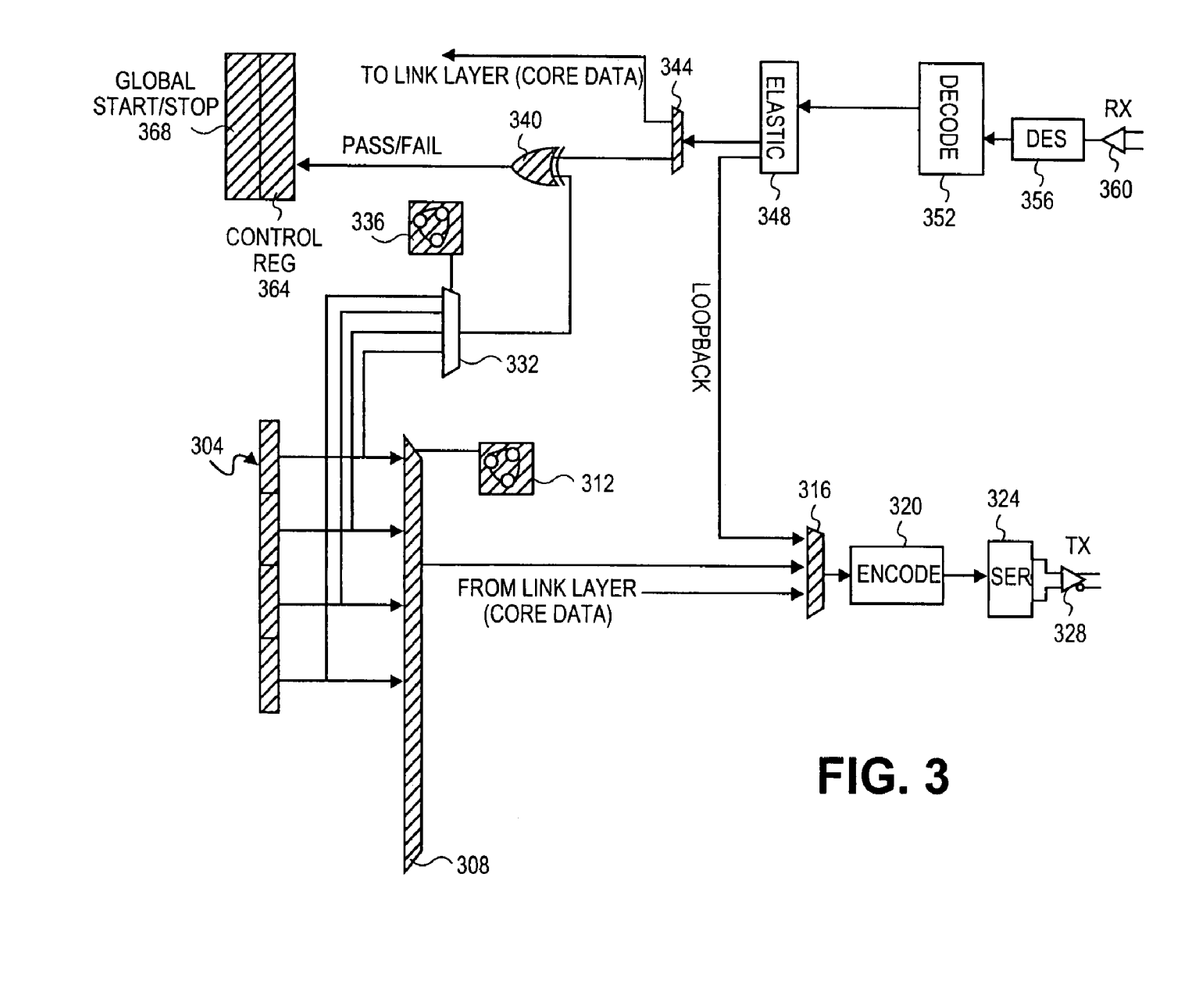
FIG. 3 depicts the control logic section for one of multiple lanes in a point-to-point link that can be used in the main memory subsystem.

Referring now to FIG. 3, a mixture of IBIST logic and existing logic and driver/receiver circuitry in the physical layer of the chip-to-chip communications protocol is shown, for transmitting and receiving over one lane. There can be multiple lanes that may make up a given connection in the main memory subsystem. The grey blocks in the figure indicate on-chip, IBIST logic whereas the clear blocks may be considered to be part of the pre-existing design of the host IC device or the memory buffer. In the transmit path, core data from the link layer of the communications protocol would normally be provided directly to an encode block 320 that may be used to balance the average signal swing of the transmission line signal that is driven by the driver circuitry 328. As an example, the output of the driver circuit 328, which in this embodiment is a differential output, feeds a single link such as link 208_2 or 209-1 of the memory module 204 (see FIG. 2). A serializer 324 may also be used to convert parallel symbols into a serial bit stream.

At the receiver end, receiver circuitry 360 translates the incoming transmission line signal into a serial bit stream that is converted into parallel symbols by a de-serializer 356. The differential input to the receiver circuit 360 may be directly connected to a single link 208_1 or 209_2 of the module 204 (see FIG. 2). Note that the connection between a host IC device and a memory module, or between memory modules, may have more than one lane in each direction. An optional decoder 352 may also be provided if the format of the symbols had been changed to balance the transmission line signal. The received symbols may be stored in an elastic block 348 for purposes of buffering, prior to being forwarded to the communication protocol's link layer.

As part of the IBIST logic, multiplexers 316 and 344 are added, to provide an additional path for test symbols to be received (multiplexer 344) and transmitted (multiplexer 316) in a test mode of operation. For multiplexer 316, an additional loop back path from the elastic block 348 is provided, so that received test symbols can be looped back, as was discussed above in connection with FIG. 2.

As shown in FIG. 3, the control logic section for one connection (which may have multiple lanes) includes a test symbol register 304 that stores a pattern of test symbols that can be transmitted or used to check received test symbols. Different test symbols may be transmitted using a multiplexer 308, under control of a state machine 312 which may be externally programmed to conduct an interconnect test using a desired sequence of test symbols. Similarly, a state machine 336 provides the desired sequence of test symbols, via a multiplexer 332, to comparison logic that in this embodiment consists of a single XOR gate 340. An alternative to this direct comparison is the use of a multiple input signature register, MISR (not shown), that accumulates both a transmitter's symbol stream and the receiver's symbol stream (where the transmitter and receiver may or may not be in the same IC die), followed by a comparison of the resulting values at regular intervals or at completion of a test session. In either case, a pass/fail indication by the comparison logic may be captured by a control register 364. As mentioned above, this error information may be accessed from outside of the device, via for example the TAP 124 (see FIG. 1). A global control register 368 is also provided, to control the start and stop of a test for this connection, that is accessible from some external mechanism such as onboard system firmware (not shown).

Figure 4:
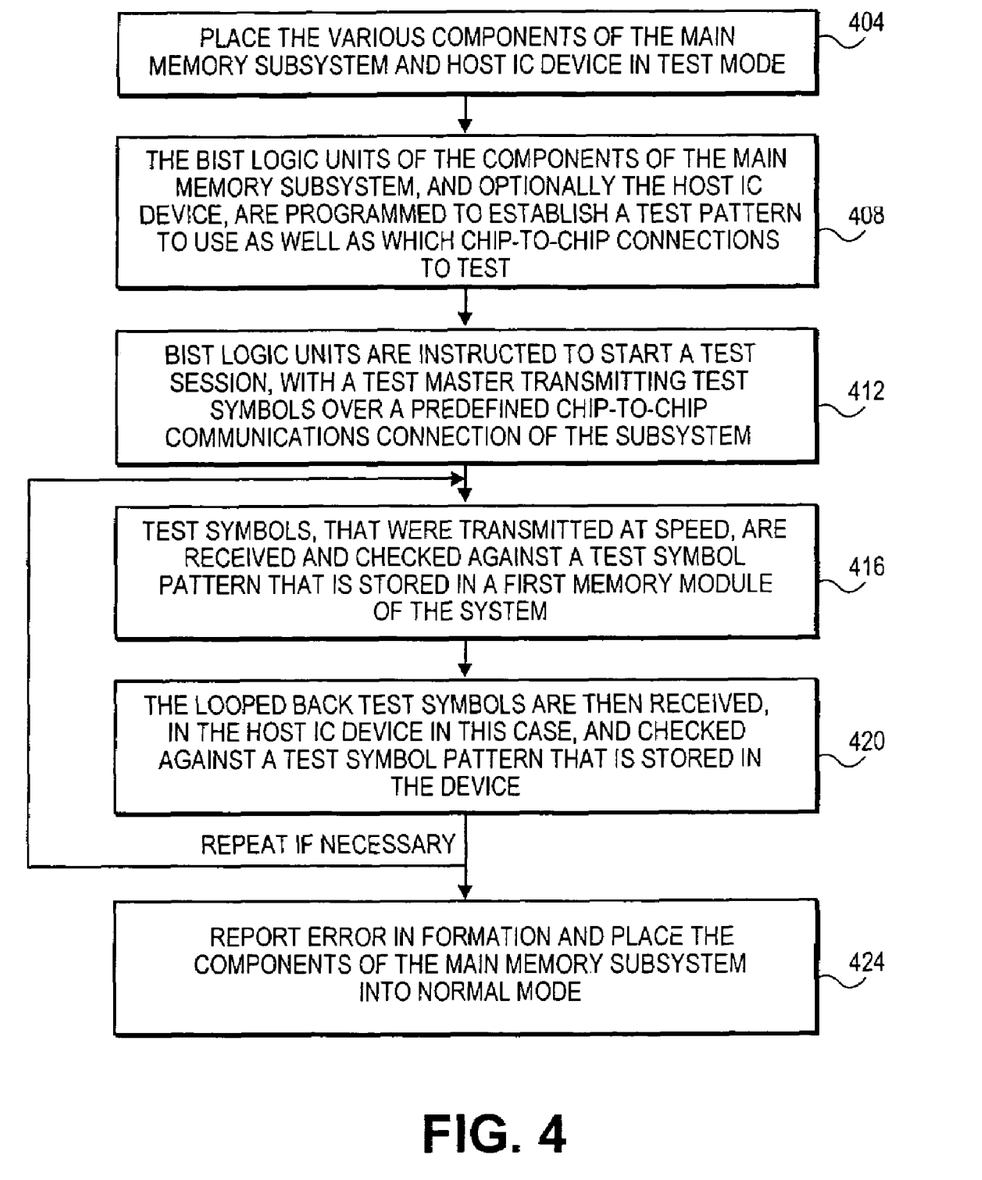
FIG. 4 shows a flow diagram of a method for testing a chip-to-chip connection in a computer system.

Turning now to FIG. 4, a flow diagram of a method for testing a chip-to-chip connection in a computer system is described. Although the flow diagram shows the various operations being linked to each other sequentially, some or all of these operations may be performed out of the order indicated and still provide their advantageous effects in terms of efficiently testing the memory subsystem. It is also assumed for this embodiment that the computer system includes a main memory subsystem installed, on for example a system board, and whose IBIST logic units can be accessed for configuration via either an external tester or via platform management system firmware. Operation may begin with placing the various components of the main memory subsystem and host IC device in test mode (block 404). This test mode may be the initial mode of operation upon the computer system being reset or initially powered on, prior to operating system boot; alternatively, it may be a special mode of operation that the computer system enters from a normal mode, via some type of platform management or other computer system internal management program (firmware)being executed.

Next, operation may proceed with block 408 in which the IBIST logic of the components of the main memory subsystem, and optionally the host IC device, are programmed to establish a test pattern to use as well as which chip-to-chip connections to test. Thus, for example, referring now to FIG. 2, the BIST generator 222 is instructed to transmit its test symbols over the link 208_1, while the BIST checker 224 is instructed to determine errors in these test symbols. In addition, the memory buffer 220 of module 204_1 is instructed to forward the test symbols to the next module, and so on until the test symbols are received by the module 204_N. The memory buffer in this last module 204_N is programmed to loop back the test symbols towards the host IC device. The BIST checker 228 in the module 204_1, as well as in other intermediate modules (not shown), is programmed to determine any error in the test symbols received. Note that all of the BIST checkers in the different modules and in the host IC device may have the same test pattern hard-wired into their logic circuitry. Alternatively, the same test pattern may be programmed into all IBIST logic that is in the test symbol path, via, as mentioned, above some type of low speed system test bus or I/O mapped register access.

Next, operation proceeds with block 412 in which the IBIST logic units are instructed to start a test session, with a test master transmitting test symbols over a predefined chip-to-chip communications connection of the subsystem. In the embodiment of FIG. 2, that would mean the BIST generator 225 launches its test symbols over the outbound link 208_1.

Operation then proceeds with block 416 in which the test symbols, that were transmitted at speed, are received and checked against a test symbol pattern that is stored in a first memory module of the system. These received test symbols are then looped in the first module, back to the host IC device over an inbound chip-to-chip communications connection of the system that is normally used by the first module to send read data at speed to the host IC device. Thus, for the embodiment of FIG. 2, this connection would be the inbound link 209_1. The looped back test symbols are then received, in the host IC device in this case, and checked against a test symbol pattern that is stored in the device (block 420). The above-described procedure in blocks 416 and 420 may be repeated until multiple test patterns have been transmitted, looped back, and checked, so that an electrical specification of one or more connections being tested, in this example the links 208_1 and 209_1 together with related analog driver and receiver circuitry as well as chip and packaging connections, have been verified. In another example, the same test pattern may be transmitted, looped back, and checked by the module 204_1 (see FIG. 2) to verify the electrical specifications of the interconnect between the module 204_1 and 204_2 (not shown), where this interconnect would include the following: analog driver circuitry in the memory buffer 220, chip-to-packaging connections of the memory buffer 220, the connector 218, outbound link 208_2, inbound link 209_2, connection points 219, connections between the connection points 219 and the die signal pads of the memory buffer 220, and finally the analog receiver circuitry of the memory buffer 220. This connection is of course the same connection that would be used by the memory buffer 220 during its normal mode of operation for repeating address, command, and/or data.

Returning to FIG. 4 now, any error information captured by the IBIST logic may be reported to, for example, system firmware or an external tester, following which the different components of the memory subsystem may be placed back into their normal mode of operation provided that is the prudent thing to do in view of the results of the test (block 424).

To summarize, various embodiments of a built-in self test methodology for computer systems have been described. In the foregoing specification, the invention has been described with reference to specific exemplary embodiments thereof. It will, however, be evident that various modifications and changes may be made thereto without departing from the broader spirit and scope of the invention as set forth in the appended claims. For example, the reference to a "computer system" is not intended to be limited to general purpose (e.g. personal) computers but rather encompasses any digital system board or platform that could benefit from the above described main memory subsystem test methodology. The specification and drawings are, accordingly, to be regarded in an illustrative rather than a restrictive sense.

What is claimed:

1. An integrated circuit (IC) device, comprising:
   memory controller logic to generate address and command information for accessing a memory device;
   a plurality of driver circuits on-chip with said memory controller logic;
   a plurality of first signal pads on-chip with said memory controller logic, the plurality of driver circuits having outputs that are coupled to the plurality of signal pads, respectively; and
   on-chip logic, coupled between the plurality of driver circuits and the controller logic, to a) transmit, at speed, address and command information generated by the controller logic, using the plurality of driver circuits and in a normal mode of operation for the IC device and b) transmit, at speed, test symbols, using the plurality of driver circuits and in a test mode of operation for the IC device during which a chip-to-chip connection between the IC device and another device is tested.

2. The IC device of claim 1 further comprising:
   a plurality of second signal pads;
   a plurality of receiver circuits whose inputs are coupled to the plurality of second signal pads, respectively; and further logic coupled between the plurality of receiver circuits and the controller logic to a) forward data, received by the plurality of receiver circuits, to the controller logic in said normal mode of operation for the IC device and b) determine error in test symbols received by the plurality of receiver circuits in a test mode of operation for the IC device during which a chip-to-chip connection between the IC device and another device is tested.

3. The IC device of claim 2 further comprising:

a test access port coupled to the logic to transfer error information regarding the determined error out of the IC device.

4. The IC device of claim 3 wherein the logic has boundary scan chain capability, to read test control and pattern information and write said error information.

5. A method for testing a chip-to-chip connection in a computer system, comprising:

transmitting test symbols from a host integrated circuit (IC) device that is installed in a computer system, over a first outbound chip-to-chip communications connection of the system normally used by the host IC device to send address and command information at speed to access an installed main memory subsystem of the system, in a test mode of operation for the host IC device during which the first outbound connection is being tested, wherein the test symbols are transmitted at speed; and receiving the test symbols and then checking them against a test symbol pattern stored in a first memory module of the subsystem.

6. The method of claim 5 further comprising:

looping the received test symbols in the first module back to the host IC device over a first inbound chip-to-chip communications connection of the system normally used by the first module to send read data at speed to the host IC device, in a test mode of operation for the host IC device during which the first inbound connection is being tested, wherein the received test symbols are looped back at speed; and receiving the looped back test symbols and then checking them against a test symbol pattern stored in the host IC device.

7. The method of claim 5 further comprising:

re-transmitting the received test symbols from the first module, over a second outbound chip-to-chip communications connection of the system normally used by the first module to send memory address and command information at speed to a second memory module of the subsystem, in a test mode of operation for the second module during which the second outbound connection is being tested, wherein the received test symbols are re-transmitted at speed; and receiving the re-transmitted test symbols and then checking them against a test symbol pattern stored in the second module.

8. The method of claim 7 further comprising:

looping the received re-transmitted test symbols in the second module back to the host IC device over a first inbound chip-to-chip communications connection of the system normally used by the second module to send read data at speed to the host IC device, in a test mode of operation for the first module during which the first inbound connection is being tested, wherein the received re-transmitted test symbols are looped back at speed; and receiving the looped back test symbols and checking them against a test symbol pattern stored in the first module.

9. The method of claim 8 further comprising:

re-transmitting the received, looped back test symbols from the first module, over a second inbound chip-to-chip communications connection of the system normally used by the first module to send read data at speed to the host IC device, in a test mode of operation for the host IC device during which the second inbound connection is being tested, wherein the received, looped back test symbols are re-transmitted at speed; and receiving the re-transmitted, received, looped back test symbols and then checking them against a test symbol pattern stored in the host IC device.

* * * * *